(12) United States Patent
McAfee

(10) Patent No.: US 6,865,693 B1
(45) Date of Patent: Mar. 8, 2005

(54) SYSTEM AND METHOD FOR DEBUGGING MULTIPROCESSOR SYSTEMS

(75) Inventor: Martin McAfee, Lago Vista, TX (US)

(73) Assignee: Dell Products, L.P., Round Rock, TX (US)

( * ) Notice: Subject to any disclaimer, the term of this patent is extended or adjusted under 35 U.S.C. 154(b) by 525 days.

(21) Appl. No.: 09/692,647

(22) Filed: Oct. 19, 2000

(51) Int. Cl.$^7$ .............................................. G06F 11/00
(52) U.S. Cl. ........................................ 714/27; 710/301
(58) Field of Search ............................. 714/27, 30, 43; 710/301

(56) References Cited

U.S. PATENT DOCUMENTS

| | | | | |
|---|---|---|---|---|
| 5,591,984 A | * | 1/1997 | Drucker ..................... | 250/551 |
| 5,615,331 A | | 3/1997 | Toorians et al. ....... | 395/182.07 |
| 5,706,447 A | | 1/1998 | Vivio ......................... | 395/309 |
| 5,734,208 A | | 3/1998 | Jones ......................... | 307/139 |
| 5,852,617 A | * | 12/1998 | Mote, Jr. ..................... | 714/726 |
| 6,249,832 B1 | * | 6/2001 | Sanders et al. ............. | 710/301 |

OTHER PUBLICATIONS

U.S. Appl. No. 09/704,626, titled "System and Method for Processor Bus Termination" by inventors James H. Singer and Sandor Farkas, filed Nov. 2, 2000.

* cited by examiner

Primary Examiner—Scott Baderman
(74) Attorney, Agent, or Firm—Baker Botts L.L.P.

(57) ABSTRACT

A debugging circuit capable of debugging a plurality of possible microprocessors, and a switch for use in the same. The debugging circuit includes a debugging port, a plurality of microprocessor sockets each adapted to receive a microprocessor, and a plurality of switches corresponding to a respective microprocessor socket. The plurality of microprocessor sockets are adapted to form a serial signal path, and each of the switches is capable of automatically detecting whether a microprocessor is present in the corresponding microprocessor socket. If a microprocessor is present, the switch is automatically configured to include the microprocessor within the signal path, and if the microprocessor is not present, the switch is automatically configured so that the signal path bypasses that microprocessor socket.

8 Claims, 2 Drawing Sheets

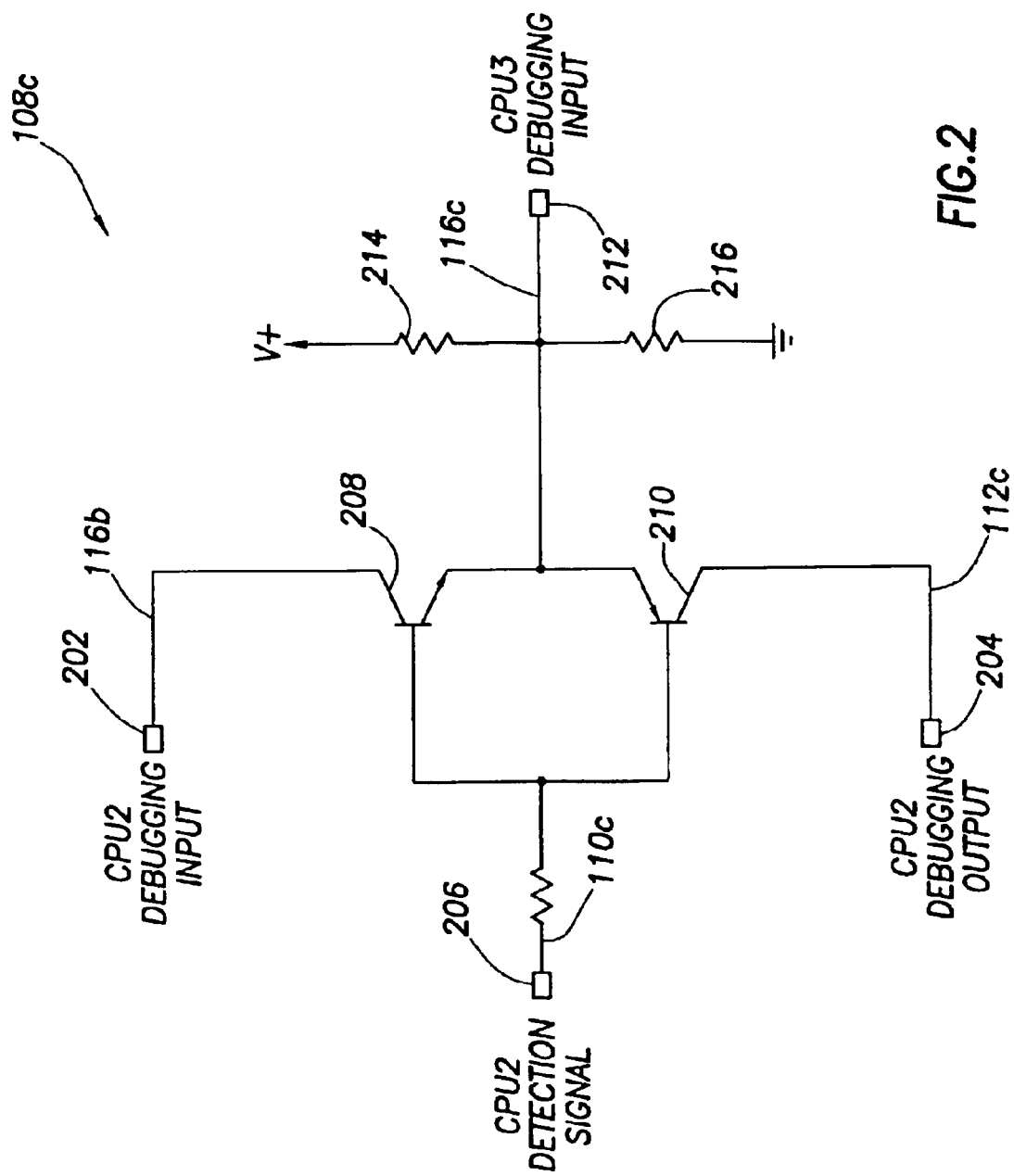

SYSTEM AND METHOD FOR DEBUGGING MULTIPROCESSOR SYSTEMS

TECHNICAL FIELD

The system and method described herein relates generally to the field of computer systems, and more particularly, to debugging a computer system having multiple processors.

BACKGROUND

A personal computer system typically includes a system unit having a central processing unit (CPU) and associated memory, and a storage device such as a hard disk, floppy disk or CD ROM. Also included are an input device, such as a keyboard or mouse, a display device, and possibly other peripherals as well. Many computer systems today include multiple CPUs mounted on what is commonly referred to as a motherboard, wherein each of these CPUs contain code known as the system BIOS ("Basic Input/Output System"). The system BIOS is responsible for testing system hardware and starting the operating system during the booting process. The BIOS also contains data and instructions that enables the transfer of data to and from the system hardware. The system BIOS is stored in system memory, typically in non-volatile memory such as read-only memory (ROM) or flash memory.

Before computer systems are sold, the BIOS must be "debugged," or tested to ensure that it is working properly, and if it is not then to ensure that any existing errors are detected land corrected. The motherboard of the computer typically includes a debug port provided for this purpose. A computer system having debugging software is connected to the motherboard via the debug port. The debug port is connected to each of the CPU sockets serially so that signals and data flow serially from the debugging computer through the debug port, and then through each successive CPU before returning to the debugging computer through the debug port.

Problems arise during debugging when one of the positions or slots on a motherboard designed to carry multiple CPUs is not occupied by a CPU. In some multiprocessor systems, an empty CPU slot must always be occupied to ensure proper termination of the line or bus during normal operation of the computer. Separate terminator cards are inserted into the unoccupied CPU slots for this purpose. These terminator cards perform required termination functions, and also, during debugging procedures, function to ensure that the signal is passed through to a subsequent CPU so as to properly complete the serial debugging circuit. An unoccupied CPU slot will otherwise cause a break in the debugging circuit, preventing altogether debugging of any CPU. Insertion of separate terminator cards in unoccupied slots is disadvantageous in that these separate terminator cards are expensive, and must be manually inserted during manufacturing.

Some more recent multiprocessor systems do not need separate terminator cards to perform termination. These systems have termination capabilities built into the CPU that ensure termination. For purposes of debugging, however, empty CPU slots still must be bypassed to complete the debugging circuit path. For these types of systems, the only known method by which to bypass unpopulated CPU slots for debugging purposes is to insert a jumper between successive CPUs, and to manually adjust the jumper when undergoing debugging versus normal operation. Jumpers that require physical manipulation prior to debugging are both labor intensive and time consuming. Further, because of space constraints it is becoming increasingly difficult to fit such jumpers between or in close proximity to the CPUs, as is required.

Accordingly, what is needed is an improved system and method for debugging multiprocessor systems that may have unoccupied CPU slots.

SUMMARY OF THE PREFERRED EMBODIMENTS

In accordance with the present disclosure, a debugging circuit capable of debugging a plurality of possible microprocessors is provided that includes a debug port, a plurality of microprocessor sockets, each of which are adapted to receive a microprocessor, and a plurality of switches, each of which correspond to a respective one of the plurality of microprocessor sockets. The plurality of microprocessor sockets are adapted to form a serial signal path, and each of the switches is capable of automatically detecting whether a microprocessor is present in the corresponding microprocessor socket. If a microprocessor is present in the corresponding microprocessor socket, then said switch is automatically configured to include the microprocessor within the signal path, and if a microprocessor is not present in the corresponding microprocessor socket then the switch is automatically configured so that the signal path bypasses the corresponding microprocessor socket.

According to one embodiment, a debugging input is provided to each microprocessor socket, and a debugging output is provided from each microprocessor that is present in the corresponding microprocessor socket. In yet another embodiment, each switch receives as an input a microprocessor detection signal indicating whether the corresponding microprocessor is present.

According to yet another embodiment, for each switch, if the microprocessor is present then the switch provides as an output the debugging output of the corresponding microprocessor. If the microprocessor is not present, then the switch provides as a switch output the debugging input to the corresponding microprocessor.

In yet another embodiment, for each switch not corresponding to a last microprocessor in the serial signal path, the switch output is provided as a debugging input to a subsequent microprocessor in the serial signal path. For the switch corresponding to the last microprocessor in the serial signal path, the switch output is provided to the debug port.

According to another embodiment, the debug port is electrically coupled to a computer and receives input from and provides output to said computer.

According to yet alternate embodiments, the plurality of switches each comprise a pair of bipolar transistors or field effect transistors.

A debugging switch is also provided for use in a debugging circuit capable of debugging a plurality of possible processors. The debugging switch includes a first node for receiving a processor detection signal indicating whether a first processor is present in a corresponding processor socket, a second node for receiving a debugging input signal to the first processor, a third node for receiving a debugging output signal from the first processor if the first processor is present in the corresponding processor socket, a fourth node for providing a switch output signal, and a switching element. If the processor detection signal indicates that the corresponding processor is not present, then the switching element is automatically configured so that the switch provides as a switch output the debugging input signal, and if the processor detection signal indicates that the corresponding processor is present, then the switching element is automatically configured so that the switch provides as a switch output the debugging output signal.

According to one embodiment, the switching element further comprises first and second bipolar transistors, and according to an alternate embodiment the switching element comprises field effect transistors. The field effect transistors may be junction field effect transistors or insulated gate field effect transistors.

According to yet another embodiment, the switch output is provided as a debugging input to a second processor.

A method for debugging at least one of a plurality of possible microprocessors is also provided including the step of providing a debugging circuit having a plurality of microprocessor sockets adapted to form a serial signal path. Each microprocessor socket corresponds to a different one of the plurality of possible microprocessors and is capable of receiving a microprocessor. The method further includes the steps of providing a switch corresponding to each of the microprocessor sockets, providing as an input to each of the switches a processor detection signal indicating whether a microprocessor is present in the corresponding microprocessor socket, providing as an input to each of the switches a processor debugging input for the corresponding microprocessor, and providing as an input to each of the switches a processor debugging output from the corresponding processor if the microprocessor is present in the corresponding microprocessor socket. The method further includes the step of the switch providing as a switch output the processor debugging input if the corresponding microprocessor is not present in the corresponding microprocessor socket, and providing as a switch output the processor debugging output if the microprocessor is present in the corresponding microprocessor socket.

According to one embodiment, the method further includes the step of, for each switch corresponding to a microprocessor that is not a last microprocessor in the serial signal path, providing the switch output as a debugging input to a subsequent microprocessor in the serial signal path. In yet another embodiment, the method further includes the step of, for the switch corresponding to the last microprocessor in the serial signal path, providing the switch output to a debug port.

According to yet another embodiment, the method further includes the step of providing as a debugging input to a first microprocessor in the serial signal path a signal received from the debug port.

BRIEF DESCRIPTION OF THE DRAWINGS

A more complete understanding of the disclosed embodiments and advantages thereof may be acquired by referring to the following description taken in conjunction with the accompanying drawings, in which like reference numbers indicate like features, and wherein:

FIG. 2 illustrates one embodiment of a switch for use in a debugging circuit capable of debugging a plurality of possible microprocessors.

DETAILED DESCRIPTION

Figure 1:
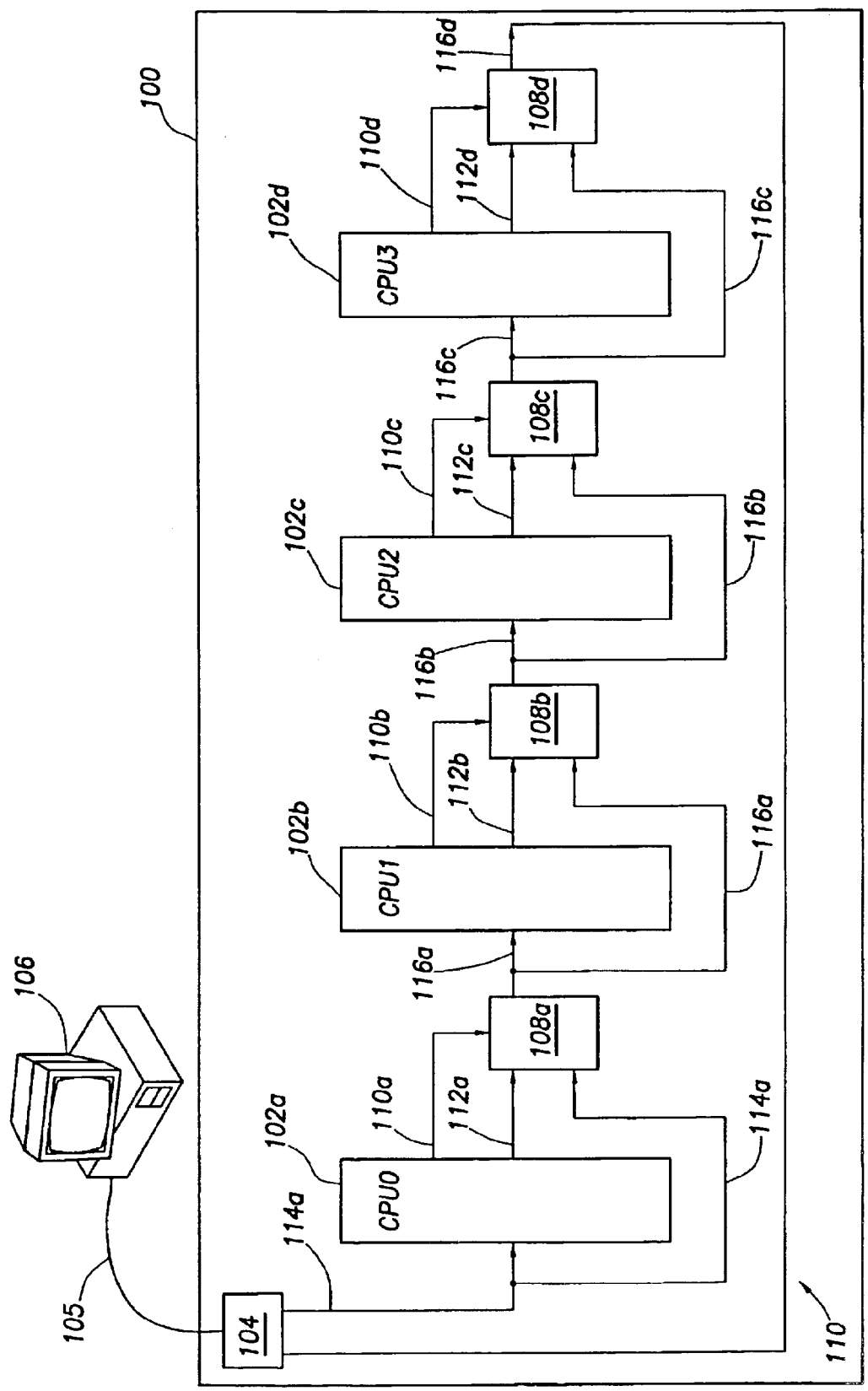
FIG. 1 illustrates a debugging circuit capable of debugging a plurality of possible microprocessors.

FIG. 1 illustrates a motherboard 100 of a computer system including multiple microprocessors (CPUs) 102a, 102b, 102c, and 102d, and a debug port 104. It is well known that each of the microprocessors are received by a corresponding microprocessor "socket" located on the motherboard. The microprocessor sockets are not shown in FIG. 1, as each such socket is occupied by a microprocessor. The debug port is a connector that enables an external computer system 106, when coupled with the debug port via cable 105 or the like, to utilize a debugging software program to communicate with the CPUs so as to monitor and/or control execution of BIOS code within each processor. A debugging circuit 110 passes signals from debug port 104 serially to each successive microprocessor socket before returning to the debug port. As will be described more fully below, the present invention automatically ensures that the serial debugging signal path is completed regardless of whether each of the possible CPUs are present in their corresponding microprocessor sockets.

Switches 108a, 108b, 108c, 108d each correspond to a respective one of the microprocessor sockets, and each preferably is in parallel with its corresponding microprocessor socket. The switches each receive as an input a processor detection signal 110a, 110b, 110c, 110d that indicates whether a microprocessor is present in the corresponding microprocessor socket. If present, the switch will automatically be configured to include that microprocessor within the debugging signal path, and if absent, the switch will automatically be configured so that the debugging signal path bypasses the unoccupied microprocessor socket.

For example, in FIG. 1, if the microprocessor detection signal 110c input to switch 108c indicates that CPU2 is not present, switch 108c will be automatically configured to provide as a debugging input to CPU3, the signal 116b that would have otherwise have been provided as the debugging input to CPU2. Thus, switch 108c automatically ensures that the debugging signal path is complete by bypassing the unoccupied microprocessor socket. If, however, CPU2 is present, switch 108c will be automatically configured to provide as a debugging input to CPU3 the debugging output signal from CPU2, thereby ensuring that CPU2 is included within the debugging signal path.

FIG. 2 illustrates one embodiment of such a switch in greater detail. For purposes of illustration, switch 108c is shown, although it will be understood that the illustrated circuit may be any of the switches shown in FIG. 1. The debugging circuit receives a microprocessor detection signal 110c that indicates whether CPU2 is present at node 206, which is electrically coupled to the microprocessor socket that is capable of receiving CPU2. According to one embodiment in which the microprocessors are Intel processors, the CPU detection signal is a SKTOCC signal, which asserts a positive voltage on node 206 when CPU2 is not present, and is grounded when CPU2 is present. Switch 108c also includes another node 204 for receiving the microprocessor debugging output of CPU2 (112c), if the CPU is present in its corresponding socket. Switch 108c includes yet another node 202 for receiving the microprocessor debugging input to CPU2 (116b). For the Intel processors referred to above, the CPU2_TDI signal is the debugging input signal for CPU2 and CPU2_TDO is the debugging output signal for CPU2. Finally, the output of switch 108c provides the debugging input signal to CPU3 (116c) (i.e., CPU3_TDI) via node 212.

The embodiment of FIG. 2 further illustrates a typical pair of bipolar transistors arranged in a well known totem pole configuration so that, depending on the input at node 206, one transistor will be turned on while the other is turned off. Thus, the signal path for the debugging circuit will either be from node 202 to node 212 so that the input to CPU2 (116b)

will be directly provided as the input to CPU3, or from node 204 to node 212, so that output of CPU2 (112c) will be provided as the input to CPU3. In other words, the input (116b) to CPU2 will directly become the input to CPU3 (116c) if CPU2 is not present, thereby effectively bypassing CPU2. On the other hand, if CPU2 is present, the output to CPU2 (112c) will become the input to CPU3 (116c), ensuring that CPU2 is included within the signal path if present.

More specifically, for transistor 208, the application of a positive voltage (i.e., 3.3V) at node 206, which in the Intel embodiment described indicates that CPU2 is not present, will cause a positive voltage to be applied to the base of the transistor, which in turn will cause the current to flow from node 202 through the transistor to node 212. Thus, if CPU2 is not present, switch 108c transfers the input to CPU2 directly to the input to CPU3, bypassing the unoccupied CPU2 slot. For transistor 210, the application of a positive voltage at node 206 turns off the transistor preventing current flow therethrough. If node 206 is grounded, however, such as is the case when CPU2 is present, then the application of this voltage level to the base of transistor 210 turns on the transistor, enabling current flow from node 204 to output node 212. When applied to the base of transistor 208, transistor 208 will be shut off, preventing current flow therethrough. Thus, when CPU2 is present, switch 108c conveys the debugging output from CPU2 directly as the debugging input for CPU3.

Resistors 214 and 216 shown in FIG. 2 are a well known pull up/pull down resistor pair used to ensure that the signal at node 212 is strong enough to maintain the integrity of the signal path. According to one embodiment, the voltage V+ applied at pull up resistor 214 is the CPU core voltage, which is typically anywhere below 2.2 volts. It will be understood by those skilled in the art that the positive voltage applied at node 206, such as to indicate the absence of CPU2 as described above, must be sufficiently above the CPU core voltage to properly enable current flow through the transistors. Therefore, this voltage should be high enough to accommodate varying CPU core voltages.

Further, although the embodiment of FIG. 2 illustrates the use of bipolar type transistors, one skilled in the art will readily recognize that the circuit of switches 108 may be constructed using any type of field effect transistors, both junction and insulated gate.

Although the present invention has been described in detail, it should be understood that various changes, substitutions and alterations can be made hereto without departing from the spirit and scope of the invention as defined by the appended claims.

What is claimed is:

1. A debugging circuit capable of transmitting a debugging signal through a multiprocessor computer, comprising:
    a debug port;
    a plurality of microprocessor sockets, each of said microprocessor sockets adapted to receive a microprocessor;
    a plurality of switches, each of said plurality of switches is associated with a respective one of said plurality of microprocessor sockets, wherein each switch includes:
        a first input to the switch, wherein the first input receives either (a) the debugging signal transmitted from the previous switch or, (b) if there is not a previous switch, the debugging signal from the debug port;
        a second input to the switch coupled to the associated microprocessor socket and operable to receive a debugging signal transmitted through a microprocessor, if present, in the associated microprocessor socket; and
        a third input coupled to the associated microprocessor socket, wherein the third input receives a logic signal from the associated microprocessor socket that is indicative of whether the associated microprocessor socket is populated by a microprocessor;
    wherein the first input is passed by the switch and the second input is not passed by the switch if the logic signal of the third input indicates that the associated microprocessor socket is not populated by a microprocessor, and wherein the second input is passed by the switch and the first input is not passed by the switch if the logic signal of the third input indicates that the associated microprocessor socket is populated by a microprocessor.

2. The debugging circuit of claim 1, wherein the debug port is electrically coupled to a computer and receives input from and provides output to the computer.

3. The debugging circuit of claim 1, wherein each switch comprises a pair of bipolar transistors.

4. The debugging circuit of claim 1, wherein each switch comprises field effect transistors.

5. A method for transmitting a debugging signal through a multiprocessor computer system, comprising:
    transmitting a debugging signal to a debug port of the computer system;
    transmitting the debugging signal through or around each microprocessor socket of the computer system, wherein the debugging signal bypasses a microprocessor socket if the microprocessor socket is not occupied by a microprocessor and wherein the debugging signal passes through any microprocessor that occupies a microprocessor socket; and
    providing a switch associated with each microprocessor socket, wherein the switch is operable to perform the step of transmitting a debugging signal through or around each microprocessor socket by,
        receiving at the switch a first signal representing either
            (a) the debugging signal from the previous switch or,
            (b) if there is not a previous switch, the debugging signal from the debug port;
        receiving at the switch a second signal representing the debugging signal transmitted from the microprocessor socket;
        receiving at the switch a third signal representing a logical signal from the microprocessor socket that is indicative of whether the associated microprocessor socket is occupied by a microprocessor; and
        passing the fist signal and blocking the second signal if the third signal indicates that the microprocessor socket is not occupied by a microprocessor, and blocking the first signal and passing the second signal if the third signal indicates that the microprocessor socket is occupied by a microprocessor.

6. The method for transmitting a debugging signal through a multiprocessor computer system of claim 5, wherein the step of transmitting a debugging signal to the debug port of the computer system comprises the step of providing a debugging signal from a debugging computer to the debug port of the computer system.

7. The method for transmitting a debugging signal through a multiprocessor computer system of claim 5, wherein each switch comprises a pair of bipolar transistors.

8. The method for transmitting a debugging signal through a multiprocessor computer system of claim 5, wherein each switch comprises field effect transistors.

* * * * *